(12) United States Patent
Chuang et al.

(10) Patent No.: US 9,461,202 B2
(45) Date of Patent: Oct. 4, 2016

(54) HIGH-EFFICIENCY LIGHT-EMITTING DEVICE AND MANUFACTURING METHOD THEREOF

(75) Inventors: Chia-Ming Chuang, Hsinchu (TW); Donald Tai-Chan Huo, Hsinchu (TW); Chia-Chen Chang, Hsinchu (TW); Tzu-Ling Yang, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 190 days.

(21) Appl. No.: 13/310,255

(22) Filed: Dec. 2, 2011

(65) Prior Publication Data

US 2012/0138991 A1  Jun. 7, 2012

Related U.S. Application Data

(63) Continuation of application No. 12/073,284, filed on Mar. 4, 2008, now Pat. No. 8,097,897, which is a continuation-in-part of application No. 11/160,354, filed on Jun. 21, 2005, now Pat. No. 7,385,226.

(51) Int. Cl.
*H01L 33/60* (2010.01)
*H01L 33/14* (2010.01)
*H01L 33/10* (2010.01)
*H01L 33/22* (2010.01)

(52) U.S. Cl.
CPC ............ *H01L 33/145* (2013.01); *H01L 33/10* (2013.01); *H01L 33/22* (2013.01)

(58) Field of Classification Search
CPC ...... H01L 33/10; H01L 33/145; H01L 33/22
USPC .............................................. 257/13
See application file for complete search history.

(56) References Cited

U.S. PATENT DOCUMENTS

| | | | |
|---|---|---|---|
| 4,911,102 A | 3/1990 | Manabe et al. | |
| 5,717,226 A * | 2/1998 | Lee et al. ................. | 257/86 |
| 5,779,924 A | 7/1998 | Krames et al. | |
| 6,078,064 A | 6/2000 | Ming-Jiunn et al. | |
| 6,169,296 B1 * | 1/2001 | Kamiyama et al. .......... | 257/94 |
| 6,420,732 B1 | 7/2002 | Kung et al. | |
| 6,504,180 B1 * | 1/2003 | Heremans et al. ............. | 257/98 |
| 6,657,236 B1 | 12/2003 | Thibeault et al. | |
| 6,730,938 B2 * | 5/2004 | Matsumoto et al. .......... | 257/96 |
| 7,335,920 B2 * | 2/2008 | Denbaars et al. ............. | 257/79 |
| 7,385,226 B2 | 6/2008 | Ou et al. | |
| 2002/0145148 A1 | 10/2002 | Okuyama et al. | |
| 2002/0179918 A1 | 12/2002 | Sung et al. | |

(Continued)

FOREIGN PATENT DOCUMENTS

| | | |
|---|---|---|
| DE | 102 60 937 A1 | 7/2004 |
| EP | 0 977 280 A2 | 2/2000 |

(Continued)

*Primary Examiner* — Ermias Woldegeorgis
*Assistant Examiner* — Benjamin Tzu-Hung Liu
(74) *Attorney, Agent, or Firm* — Ditthavong & Steiner, P.C.

(57) ABSTRACT

This invention provides a high-efficiency light-emitting device and the manufacturing method thereof The high-efficiency light-emitting device includes a substrate; a reflective layer; a bonding layer; a first semiconductor layer; an active layer; and a second semiconductor layer formed on the active layer. The second semiconductor layer includes a first surface having a first lower region and a first higher region.

17 Claims, 6 Drawing Sheets

(56) References Cited

U.S. PATENT DOCUMENTS

| | | |
|---|---|---|
| 2003/0040167 A1 | 2/2003 | Nagasawa et al. |
| 2003/0218179 A1 | 11/2003 | Koide et al. |
| 2004/0189184 A1 | 9/2004 | Takaki |
| 2005/0184299 A1* | 8/2005 | Matsumura et al. ............ 257/79 |
| 2005/0211995 A1 | 9/2005 | Ou et al. |
| 2005/0236632 A1* | 10/2005 | Lai et al. .......................... 257/94 |
| 2006/0002442 A1* | 1/2006 | Haberern et al. ........... 372/46.01 |
| 2007/0145391 A1 | 6/2007 | Baik et al. |
| 2007/0221944 A1 | 9/2007 | Cheol Yoo |
| 2008/0315220 A1 | 12/2008 | Lee et al. |

FOREIGN PATENT DOCUMENTS

| | | |
|---|---|---|
| EP | 1 363 334 A1 | 11/2003 |
| EP | 10 2005 013 580 A1 | 10/2005 |
| JP | 06-291368 A | 10/1994 |
| JP | 10-189480 A | 7/1998 |
| JP | 2000-101142 A | 4/2000 |
| JP | 2000-244070 A | 9/2000 |
| JP | 2002-299769 A | 10/2002 |
| JP | 2003-060236 A | 2/2003 |
| TW | 459407 B | 10/2001 |
| WO | WO 2004/057680 A1 | 7/2004 |

* cited by examiner

HIGH-EFFICIENCY LIGHT-EMITTING DEVICE AND MANUFACTURING METHOD THEREOF

RELATED APPLICATION

This application is a continuation application of U.S. application Ser. No. 12/073,284, filed on Mar. 4, 2008, which is a continuation-in-part application of U.S. Pat. No. 7,385,226, filed on Jun. 21, 2005, the contents of which are incorporated herein by reference.

TECHNICAL FIELD

The present invention relates to a light-emitting device, and more particularly, to a high-efficiency light-emitting device.

BACKGROUND

Semiconductor light-emitting diode (LED) devices have been applied widely in optical display devices, traffic signals, data storing devices, communication devices, illumination devices, and medical apparatuses. In the conventional LED, a metal layer, such as a Ti/Au or Cr/Au layer, is used as an electrode. However, metal absorbs light and results in a low light-emitting efficiency of the LED device. As a result, an LED device includes a reflective metal layer formed between an electrode and a light-emitting stacked layer for improving the light-emitting efficiency. However, the aforementioned structure brings about the reliability and peeling issues between the reflective metal layer and a light-emitting stacked layer because of the poor adhesion between the reflective metal layer with high reflectivity and a semiconductor layer of the light-emitting stacked layer.

SUMMARY OF THE DISCLOSURE

A high-efficiency light-emitting device includes a substrate; a reflective layer formed on the substrate; a bonding layer formed on the reflective layer; a first semiconductor layer formed on the bonding layer; an active layer formed on the first semiconductor layer; and a second semiconductor layer formed on the active layer. The second semiconductor layer includes a first surface having a first lower region and a first higher region. The high-efficiency light-emitting device further includes an electrical structure including a first electrode formed on the first lower region, and a second electrode formed under the substrate.

In another embodiment, the high-efficiency light-emitting device further includes a first current blocking layer formed on the lower region and a first current spreading layer formed on the first surface of the second semiconductor layer and the first current blocking layer, wherein the first current spreading layer covers the first higher region. The first electrode is located on the first current spreading layer and right above the first current blocking layer.

In another embodiment, the first higher region further includes a first plurality of hexagonal-pyramid cavities extending downward from the first surface for increasing the light extraction efficiency.

In another embodiment, a high-efficiency light-emitting device includes a substrate; a reflective layer formed on the substrate; a bonding layer formed on the reflective layer; a first semiconductor layer formed on the bonding layer; an active layer formed on the first semiconductor layer; and a second semiconductor layer formed on the active layer. The second semiconductor layer includes a first surface having a first lower region and a first higher region. The first semiconductor layer includes a second surface having a second lower region and a second higher region. The high-efficiency light-emitting device further includes an electrical structure including a first electrode formed on the first lower region and a second electrode formed on the second lower region.

In another embodiment, the high-efficiency light-emitting device further includes a first current blocking layer formed on the first lower region and a first current spreading layer formed on the first surface of the second semiconductor layer and the first current blocking layer, wherein the first current spreading layer covers the first higher region. In addition, the high-efficiency light-emitting device further includes a second current blocking layer formed on the second lower region and a second current spreading layer formed on the second surface of the first semiconductor layer and the second current blocking layer, wherein the second current spreading layer covers the second higher region. The first electrode is located on the first current spreading layer and right above the first current blocking layer. The second electrode is located on the second current spreading layer and right above the second current blocking layer.

In another embodiment, the first higher region and the second higher region include a first plurality of hexagonal-pyramid cavities extending downward from the first surface and a second plurality of hexagonal-pyramid cavities extending downward from the second surface respectively for increasing the light extraction efficiency.

In another embodiment, a method of manufacturing the high-efficiency light-emitting device includes the steps of providing a substrate; forming a reflective layer on the substrate; forming a bonding layer on the reflective layer; forming a first semiconductor layer on the bonding layer; forming an active layer on the first semiconductor layer; forming a second semiconductor layer on the active layer; removing a portion of the second semiconductor layer, the active layer, and the first semiconductor layer to expose a second surface of the first semiconductor layer; roughening a first surface of the second semiconductor layer and the second surface; forming a first lower region on the first surface and a second lower region on the second surface; forming a first current blocking layer on the first lower region and a second current blocking layer on the second lower region; forming a first current spreading layer on the second semiconductor layer and the first current blocking layer, and a second current spreading layer on the first semiconductor layer and the second current blocking layer; forming a first electrode on the first current spreading layer; and forming a second electrode on the second current spreading layer.

DETAILED DESCRIPTION OF THE PREFERRED EMBODIMENTS

Figure 1A:
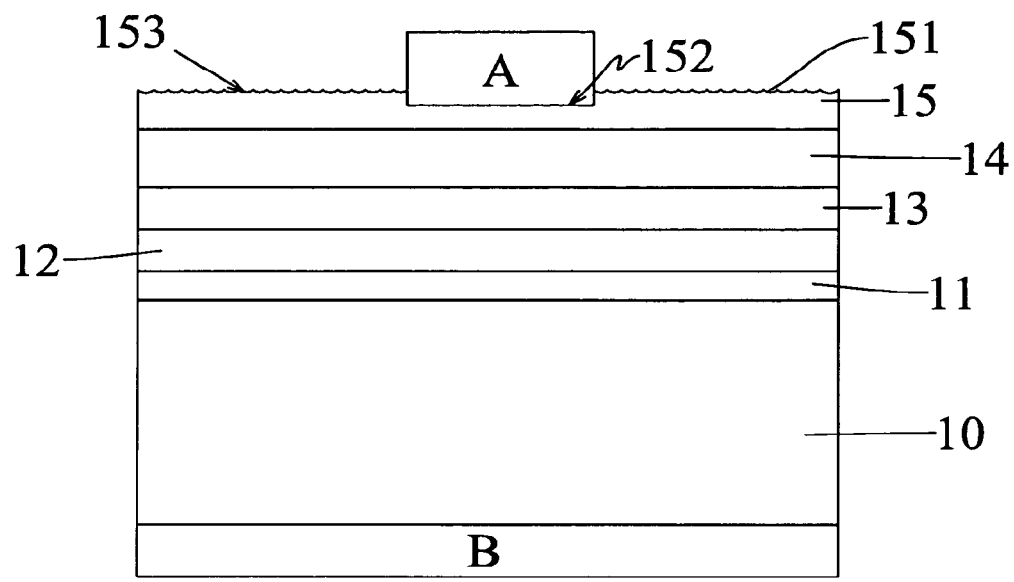
FIG. 1A shows a cross-sectional view of a high-efficiency light-emitting device in accordance with an embodiment of the present invention.

Referring FIG. 1A, a high-efficiency light-emitting device 1 includes a substrate 10; a reflective layer 11 formed on the substrate 10; a bonding layer 12 formed on the reflective layer 11; a first semiconductor layer 13 formed on the bonding layer 12; an active layer 14 formed on the first semiconductor layer 13; and a second semiconductor layer 15 formed on the active layer 14. The second semiconductor layer 15 has a first surface 151 away from the active layer 14 wherein the first surface 151 has a first lower region 152 and a first higher region 153.

The first lower region 152 can be formed by wet etching, dry etching, Chemical Mechanical Polishing (CMP), or Inductively Coupled Plasma (ICP) and has a reflectivity which is at least 70% of that of an aluminum mirror. In order to obtain a better reflectivity, the roughness of the first lower region 152 is less than that of the first higher region 153, preferably to be a flat surface. Because the surface of the first lower region 152 has smaller roughness, it results in a reduced critical angle at the interface between the first lower region 152 and a first electrode A, the probability of total reflection of the light generated from the active layer 14 emitting to the first lower region 152 is increased. The light reflected by the first lower region 152 can be then reflected by the reflective layer 11 and emit to the first higher region 153, and then be extracted with higher probability. Furthermore, the depth from the first higher region 153 to the first lower region 152 is about 100 nm~1 µm, preferably about 200 nm~300 nm. The first lower region 152 occupies less than 30% of the surface area of the first surface 151 of the second semiconductor layer 15.

The first higher region 153 can be an uneven surface formed during the epitaxy process by tuning and controlling the process parameters, such as gas flow rate, chamber pressure, chamber temperature, etc. The first higher region 153 can also be formed in a periodic, quasi-periodic, or random pattern by removing a part of the second semiconductor layer 15 by wet etching, dry etching, or lithography and so on. Because of the uneven surface of the first higher region 153, the light extraction efficiency is increased with respect to the light emitting to the first higher region 153. The first higher region 153 can also be a plurality of convexes and/or a plurality of concaves.

The substrate 10 can be a Metal Matrix Composite (MMC), Ceramic Matrix Composite (CMC), Si, IP, ZnSe, AlN, GaAs, SiC, GaP, GaAsP, sapphire, ZnSe, ZnO, InP, $LiGaO_2$, $LiAlO_2$, or the combination thereof. The reflective layer 11 can be In, Sn, Al, Au, Pt, Zn, Ag, Ti, Pb, Ge, Cu, Ni, AuBe, AuGe, AuZn, PbSn, the combination thereof, or a Distributed Bragg Reflector (DBR). The bonding layer 12 can be polyimide (PI), benzocyclobutene (BCB), perfluorocyclobutane (PFCB), epoxy, Su8, indium tin oxide, $SiN_x$, spin-on glass (SOG), $SiO_2$, $TiO_2$, MgO, In, Sn, Al, Au, Pt, Zn, Ag, Ti, Pb, Pd, Ge, Cu, Ni, AuSn, InAg, InAu, AuBe, AuGe, AuZn, PbSn, PdIn, organic bonding material, or the combination thereof. The polarity of the first semiconductor layer 13 is different from that of the second semiconductor layer 15. The active layer 14 can be semiconductor of II-VI group or III-V group, such as AlGaInP, AlN, GaN, AlGaN, InGaN, AlInGaN, or CdZnSe. The high-efficiency light-emitting device 1 further includes an electrical structure including the first electrode A formed on the first lower region 152, and a second electrode B formed under the substrate 10. Preferably, the substrate 10, the reflective layer 11, and the bonding layer 12 can be conductive. The first electrode A and the second electrode B are located on the opposite sides of the substrate 10 and form ohmic contacts with the second semiconductor layer 15 and the substrate 10 respectively. The first lower region 152 can also form a pattern like a circle with a plurality of protrusions extending outward or other shapes. The first electrode A can be formed thereon to have the same pattern defined by that of the first lower region 152.

Figure 1B:
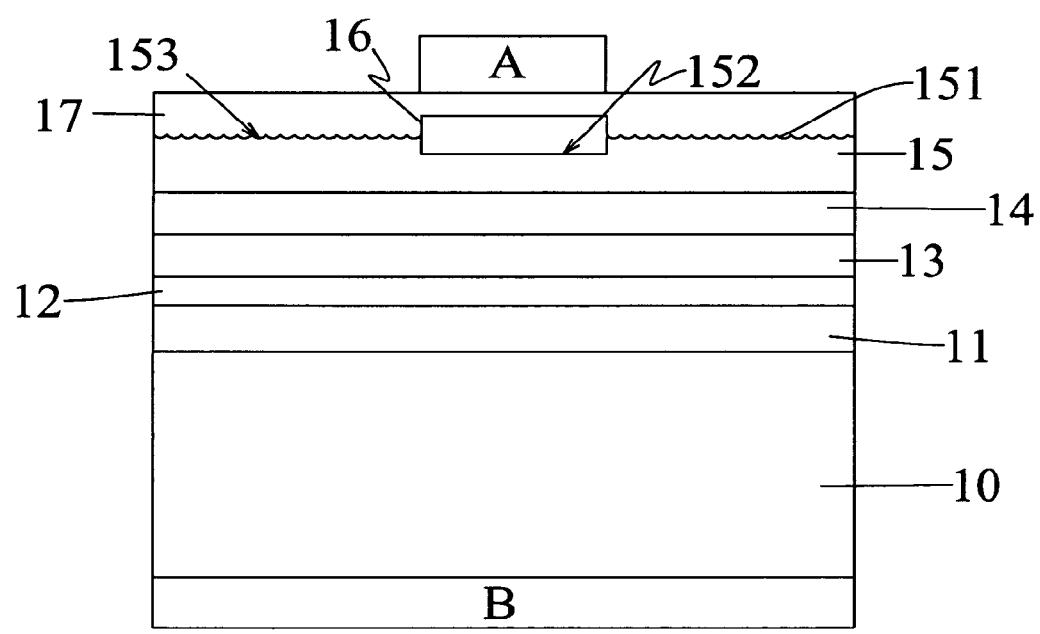
FIG. 1B shows a cross-sectional view of a high-efficiency light-emitting device in accordance with another embodiment of the present invention.

Referring to FIG. 1B, in another embodiment, the electrical structure further includes a first current blocking layer 16 formed on the first lower region 152, and a first current spreading layer 17 formed on the second semiconductor layer 15 and the first current blocking layer 16, wherein the first current spreading layer 17 covers the first higher region 153. The first electrode A is located on the first current spreading layer 17 and right above the first current blocking layer 16. The first current blocking layer 16 can be dielectric materials, such as Su8, BCB, PFCB, epoxy, acrylic resin, COC, PMMA, PET, PC, polyetherimide, fluorocarbon polymer, silicone, glass, $Al_2O_3$, $SiO_2$, $SiN_x$, $SiO_2$, $TiO_2$, insulating material, or the combination thereof, andx blocks the current to pass itself. Because the resistivity of the first current blocking layer 16 is higher, the current is conducted to the first higher region 153 by the first current spreading layer 17 and then passes to the active layer 14 for emitting light. However, the current can not pass the part of the active layer 14 right under the first current blocking layer 16, and there is no light emitted. Therefore, the probability that the first electrode A absorbs the light generated by the part of the active layer 14 right under the first electrode A is reduced. The first current spreading layer 17 can spread the current to the second semiconductor layer 15 uniformly, and can be transparent conductive materials like GaP, ITO, InO, SnO, CTO, ATO, ZnO, or the combination thereof.

Figure 1C:
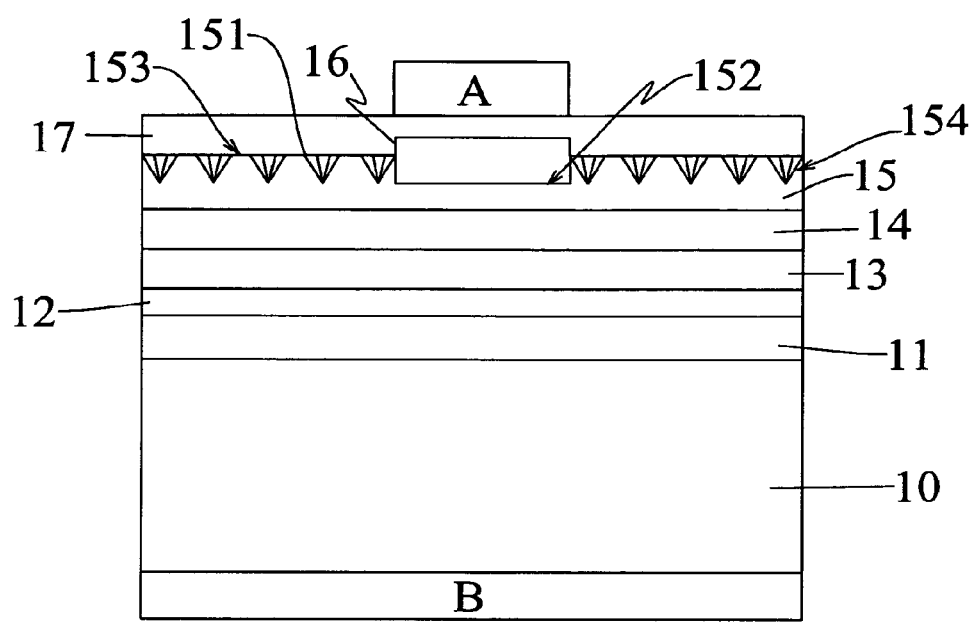
FIG. 1C shows a cross-sectional view of a high-efficiency light-emitting device in accordance with another embodiment of the present invention.

As shown in FIG. 1C, the first higher region 153 can be a first plurality of hexagonal-pyramid cavities 154 extending downward from the first surface 151 for increasing the light extraction efficiency. A depth between the first higher region 153 and the first lower region 152 is about 100 nm~1 µm, preferably 200 nm~300 nm. The roughness of the first lower region 152 is less than that of the first higher region 153, and preferably to be close to that of a flat plane. In addition, the second semiconductor layer 15 can be nitride semiconductor and the substrate 10 can be sapphire. The detailed description can refer to the contents of the U.S. patent application, Ser. No. 11/160,354, entitled "LIGHT-EMITTING DEVICE", filed on Jun. 21, 2005, which is incorporated herein by reference.

Figure 2A:
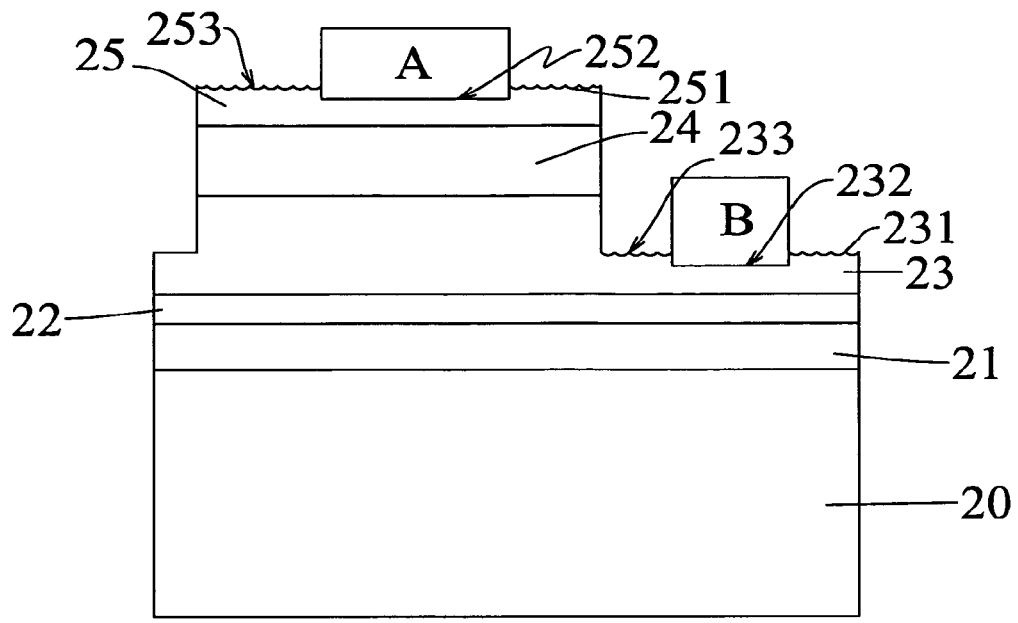
FIG. 2A shows a cross-sectional view of a high-efficiency light-emitting device in accordance with another embodiment of the present invention.

Referring FIG. 2A, in another embodiment, a high-efficiency light-emitting device 2 includes a substrate 20; a reflective layer 21 formed on the substrate 20; a bonding layer 22 formed on the reflective layer 21; a first semiconductor layer 23 formed on the bonding layer 22; an active layer 24 formed on the first semiconductor layer 23; and a second semiconductor layer 25 formed on the active layer 24. The second semiconductor layer 25 has a first surface 251 away from the active layer 24 wherein the first surface 251 has a first lower region 252 and a first higher region 253. The first semiconductor layer 23 has a second surface 231 close to the active layer 24 wherein the second surface 231 has a second lower region 232 and a second higher region 233.

The first lower region 252 and the second lower region 232 can be formed by wet etching, dry etching, Chemical Mechanical Polishing (CMP), or Inductively Coupled Plasma (ICP) and have a reflectivity which is at least 70% of that of an aluminum mirror. In order to obtain a better reflectivity, the roughness of the first lower region 252 and the second lower region 232 is lower than that of the first higher region 253 and the second higher region 233 respectively, preferably to be close to that of a flat plane. Because the surfaces of the first lower region 252 and the second lower region 232 have smaller roughness, they result in reduced critical angles at the interfaces between the first lower region 252 and a first electrode A and between the second lower region 232 and a second electrode B, and the probability of total reflection of the light generated from the active layer 24 emitting to the first lower region 252 and the second lower region 232 is increased. The light reflected by the first lower region 252 and the second lower region 232 can be then reflected by the reflective layer 21 and emit to the first higher region 253 and the second higher region 233, and then be extracted with higher probability. The depth from the first higher region 253 to the first lower region 252 and from the second higher region 233 to the second lower region 232 is about 100 nm~1 μm respectively, preferably about 200 nm~300 nm. The first lower region 252 and the second lower region 232 occupy less than 30% of the surface area of the first surface 251 of the second semiconductor layer 25 and of the second surface 231 of the first semiconductor layer 23 respectively.

The first higher region 253 and the second higher region 233 can be uneven surfaces formed during the epitaxy process by tuning and controlling the process parameters, such as gas flow rate, chamber pressure, chamber temperature, etc. The first higher region 253 and the second higher region 233 can also be formed in a periodic, quasi-periodic, or random pattern by removing a part of the first semiconductor layer 23 and the second semiconductor layer 25 respectively by wet etching, dry etching, or lithography and so on. Because of the uneven surfaces of the first higher region 253 and the second higher region 233, the light extraction efficiency is increased with respect to the light emitting to the first higher region 253 and the second higher region 233. The first higher region 253 and the second higher region 233 can also be a plurality of convexes and/or a plurality of concaves.

The high-efficiency light-emitting device 2 further includes an electrical structure including the first electrode A and the second electrode B. A portion of the second semiconductor layer 25, the active layer 24, and the first semiconductor layer 23 are removed to expose the second surface 231. The first electrode A and the second electrode B are located on the first lower region 252 and the second lower region 232, and form ohmic contacts with the second semiconductor layer 25 and the first semiconductor layer 23 respectively. Preferably, the substrate 20, the reflective layer 21, or the bonding layer 22 can be insulating. The first lower region 252 and the second lower region 232 can also form patterns like a circle with a plurality of protrusions extending outward or other shapes. The first electrode A and the second electrode B formed thereon can have the same pattern as that of the first lower region 252 and the second lower region 232 respectively. The first electrode A and the second electrode B can be formed in different patterns defined by that of the first lower region 252 and the second lower region 232 respectively.

Figure 2B:
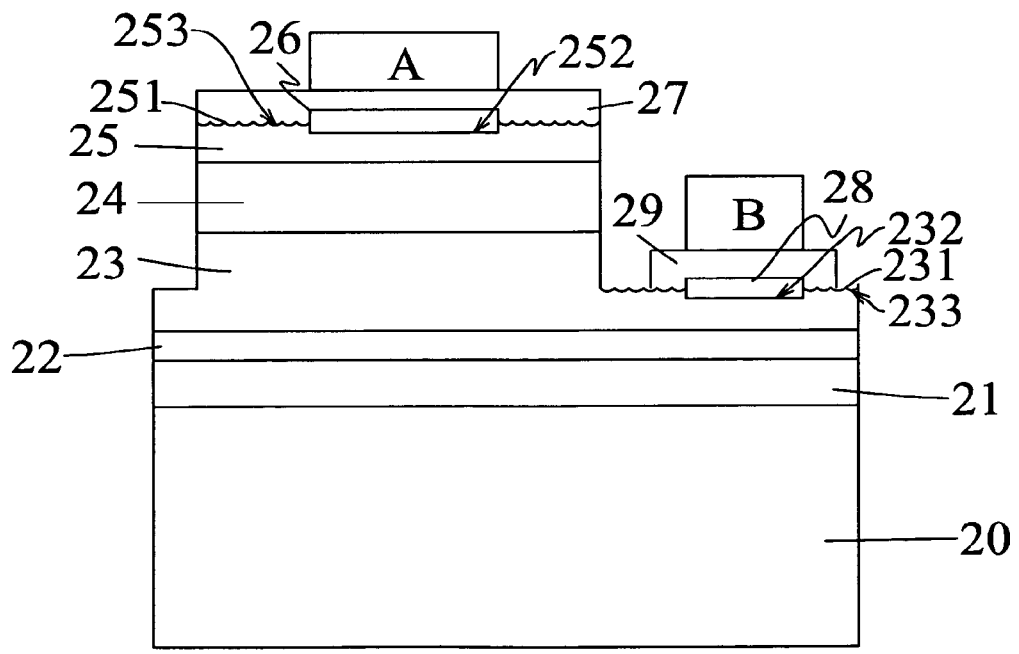
FIG. 2B shows a cross-sectional view of a high-efficiency light-emitting device in accordance with another embodiment of the present invention.

Referring to FIG. 2B, in another embodiment, the electrical structure further includes a first current blocking layer 26 formed on the first lower region 252, and a first current spreading layer 27 formed on the second semiconductor layer 25 and the first current blocking layer 26, wherein the first current spreading layer 27 covers the first higher region 253. The first electrode A is located on the first current spreading layer 27 and right above the first current blocking layer 26. In addition, the electrical structure further includes a second current blocking layer 28 formed on the second lower region 232, and a second current spreading layer 29 formed on the first semiconductor layer 23 and the second current blocking layer 28, wherein the second current spreading layer 29 covers the second higher region 233. The second electrode B is located on the second current spreading layer 29 and right above the second current blocking layer 28. The first current blocking layer 26 and the second current blocking layer 28 can be dielectric materials, such as Su8, BCB, PFCB, epoxy, acrylic resin, COC, PMMA, PET, PC, polyetherimide, fluorocarbon polymer, silicone, glass, $Al_2O_3$, $SiO_2$, $SiN_x$, $SiO_2$, $TiO_2$, insulating material, or the combination thereof, and block the current to pass themselves. Because the resistivity of the first current blocking layer 26 and the second current blocking layer 28 is higher, the current is conducted to the first higher region 253 and the second higher region 233 by the first current spreading layer 27 and the second current spreading layer 29 and then passes to the active layer 24 for emitting light. However, the current can not pass the part of the active layer 24 right under the first current blocking layer 26, and there is no light emitted. Therefore, the probability that the first electrode A absorbs the light generated by the part of the active layer 24 right under the first electrode A is reduced. The first current spreading layer 27 and the second current spreading layer 29 can spread the current to the second semiconductor layer 25 and the first semiconductor layer 23 uniformly, and can be transparent conductive materials like GaP, ITO, InO, SnO, CTO, ATO, ZnO, or the combination thereof.

Figure 2C:
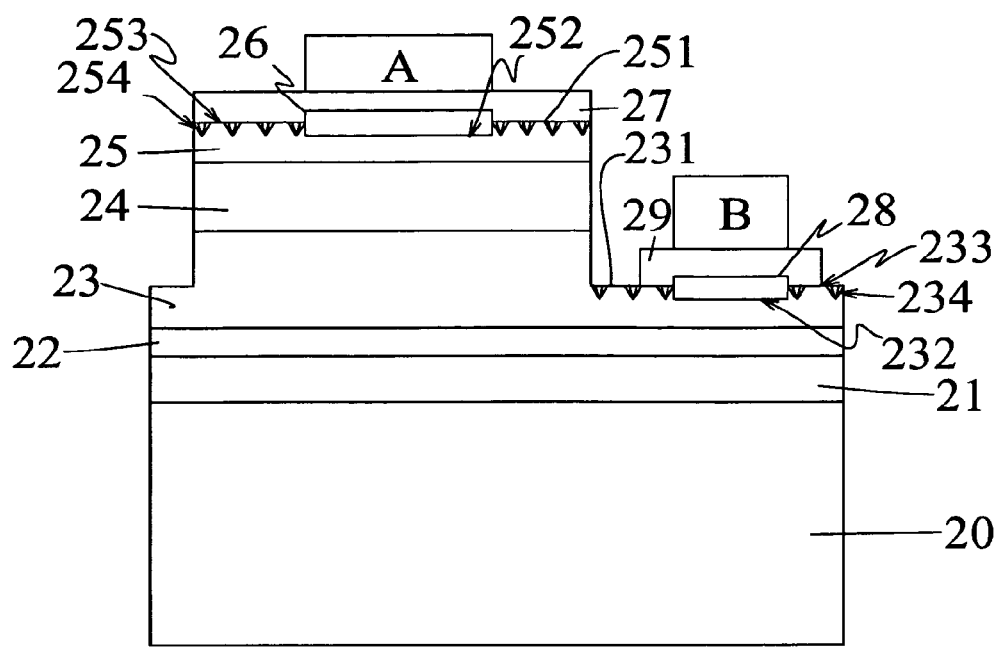
FIG. 2C shows a cross-sectional view of a high-efficiency light-emitting device in accordance with another embodiment of the present invention.

As shown in FIG. 2C, the first higher region 253 and the second higher region 233 can also be a first plurality of hexagonal-pyramid cavities 254 extending downward from the first surface 251 and a second plurality of hexagonal-pyramid cavities 234 extending downward form the second surface 231 respectively for increasing the light extraction efficiency. A depth from the first higher region 253 to the first lower region 252 and from the second higher region 233 to the second lower region 232 is about 100nm~1 μm, preferably about 200 nm~300 nm, respectively. A roughness of the first lower region 252 is less than that of the first higher region 253. A roughness of the second lower region 232 is lower than that of the second higher region 233, and both preferably to be close to that of a flat plane. In addition, the first semiconductor layer 23 and the second semiconductor layer 25 can be nitride semiconductors and the substrate 20 can be sapphire. The detailed description can refer to the contents of the U.S. patent application, Ser. No. 11/160,354, entitled "LIGHT-EMITTING DEVICE", filed on Jun. 21, 2005, which is incorporated herein by reference.

Figure 3A:
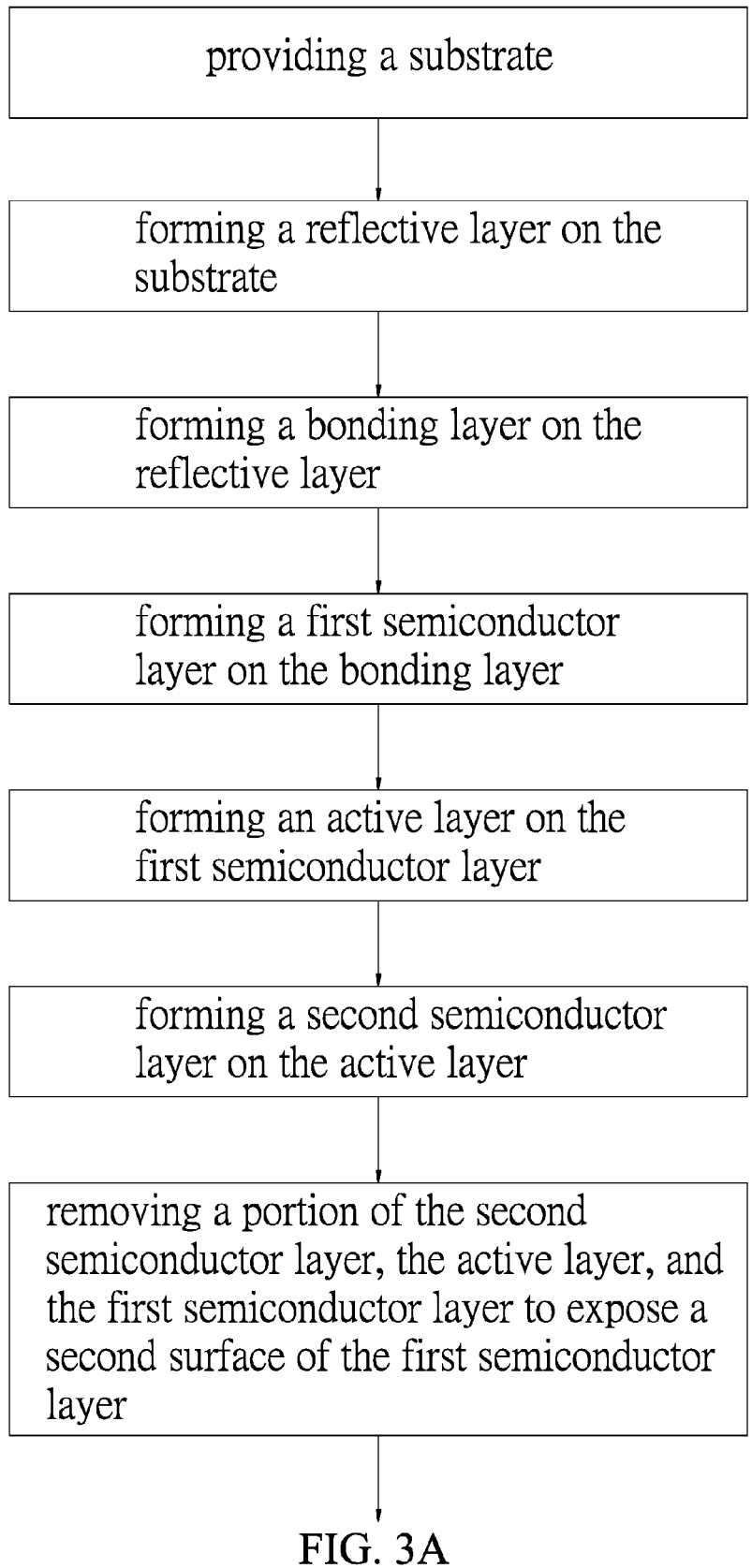
FIGS. 3A and 3B, taken together, show a flow chart of a method of manufacturing a high-efficiency light-emitting device in accordance with an embodiment of the present invention.
Figure 3B:
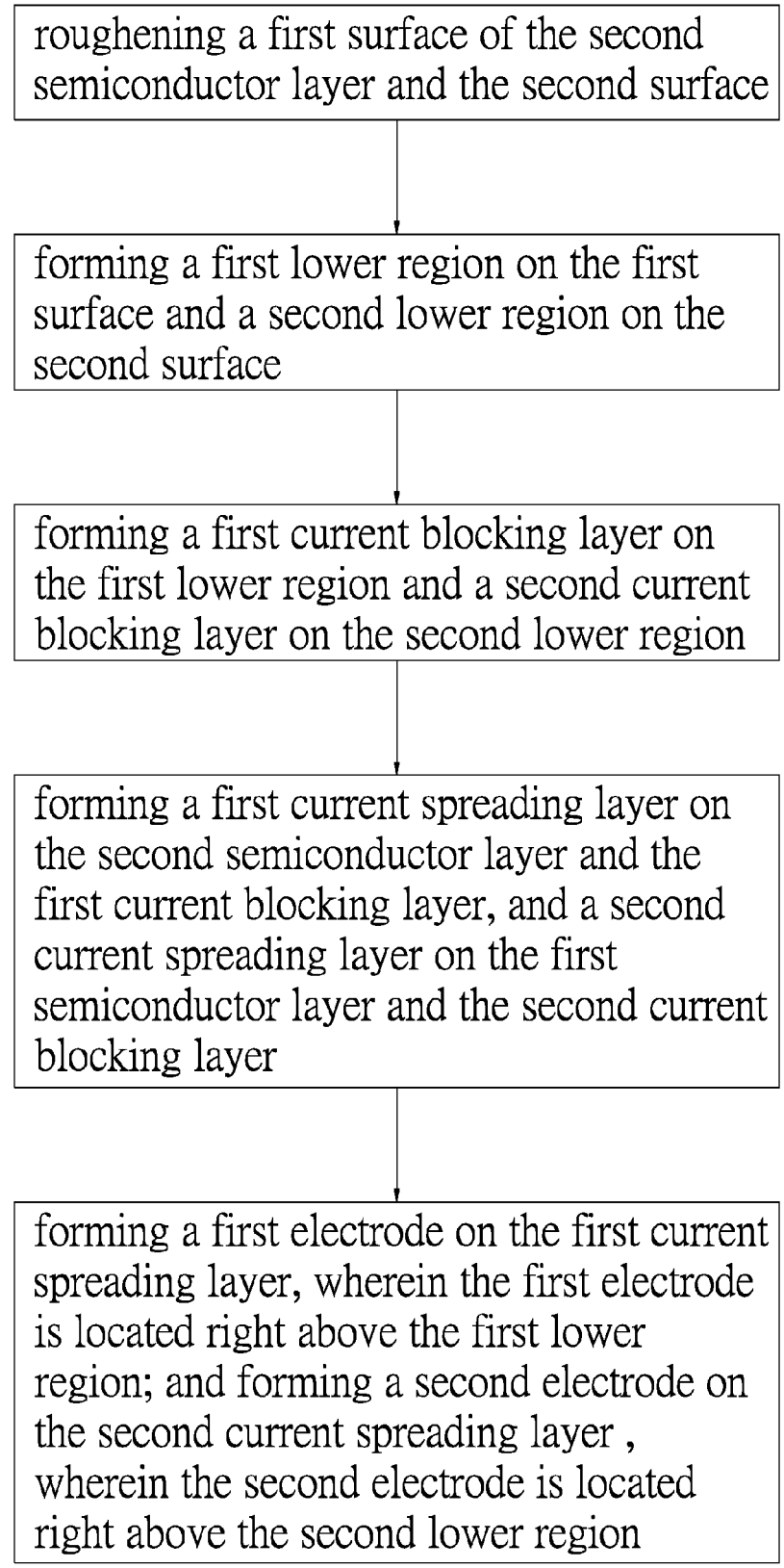

Referring to FIGS. 3A and 3B, in another embodiment, a method of manufacturing the high-efficiency light-emitting device 2 includes the steps of providing a substrate 20; forming a reflective layer 21 on the substrate 20; forming a bonding layer 22 on the reflective layer 21; forming a first semiconductor layer 23 on the bonding layer 22; forming an active layer 24 on the first semiconductor layer 23; forming a second semiconductor layer 25 on the active layer 24; removing a portion of the second semiconductor layer 25, the active layer 24, and the first semiconductor layer 23 to expose a second surface 231 of the first semiconductor layer 23; roughening a first surface 251 of the second semiconductor layer 25 and the second surface 231; forming a first lower region 252 on the first surface 251 and a second lower region 232 on the second surface 231, wherein the first surface 251 includes a first higher region 253 next to the first lower region 252 and the second surface 231 includes a second higher region 233 next to the second lower region 232; forming a first current blocking layer 26 on the first lower region 252 and a second current blocking layer 28 on the second lower region 232; forming a first current spreading layer 27 on the second semiconductor layer 25 and the first current blocking layer 26, and a second current spreading layer 29 on the first semiconductor layer 23 and the second current blocking layer 28; forming a first electrode A on the first current spreading layer 27, wherein the first electrode A is located right above the first lower region 252; and forming a second electrode B on the second current spreading layer 29, wherein the second electrode B is located right above the second lower region 232; wherein a roughness of the first lower region 252 is less than that of the first higher region 253, and a roughness of the second lower region 232 is less than that of the second higher region 233. A depth from the first higher region 253 to the first lower region 252 is about 100 nm~1 µm, preferably about 200 nm~300 nm, and a depth from the second higher region 233 to the second lower region 232 is about 100 nm~1 µm, preferably about 200 nm~300 nm.

A method of roughening a first surface 251 and the second surface 231 includes wet etching, dry etching, or lithography and so on forming a periodic, quasi-periodic, or random pattern. In addition, the method of roughening a first surface 251 and the second surface 231 also includes forming a first plurality of hexagonal-pyramid cavities 254 extending downward from the first surface 251 and a second plurality of hexagonal-pyramid cavities 234 extending downward from the second surface 231 during the epitaxy process by tuning and controlling the process parameters, such as gas flow rate, chamber pressure, chamber temperature, etc. The detailed description can refer to the contents of the U.S. patent application, Ser. No. 11/160,354, entitled "LIGHT-EMITTING DEVICE", filed on Jun. 21, 2005, which is incorporated herein by reference.

An electro- or photo-sensitive thin film is applied to the first surface 251 and the second surface 231. The electro- or photo-sensitive thin film is exposed to electron-beam lithography, laser beam interference, or UV radiation, etc, and a desired pattern is developed. After developing the desired pattern, a method of forming a first lower region 252 on the first surface 251 and a second lower region 232 on the second surface 231 includes dry etching, wet etching, Chemical Mechanical Polishing (CMP), or Inductively Coupled Plasma (ICP). An etchant includes but not limited to $H_3PO_4$ or KOH. A preferable temperature of the process is about 120° C. to steady and control the etching rate. The first lower region 252 and the second lower region 232 are lower than the first higher region 253 and the second higher region 233 respectively in about 100 nm~1 µm, preferably about 200 nm~300 nm. A roughness of the first lower region 252 is less than that of the first higher region 253, and a roughness of the second lower region 232 is less than that of the second higher region 233.

It should be noted that the proposed various embodiments are not for the purpose to limit the scope of the invention. Any possible modifications without departing from the spirit of the invention are covered by the appended claims.

What is claimed is:

1. A light-emitting device comprising:
   a substrate;
   a semiconductor stack layer on the substrate, comprising a first semiconductor layer; an active layer formed on the first semiconductor layer; and a second semiconductor layer formed on the active layer, wherein the second semiconductor layer comprises a first surface composed of a first non-recess region and a first recess region closer to the active layer than the first non-recess region, the first semiconductor layer comprises a second surface composed of a second recess region and a second non-recess region;
   a first current blocking layer comprising an insulating material formed on the first recess region;
   a second current blocking layer formed on the second recess region;
   a first electrode on the first recess region and separated from the first current blocking layer; and
   a second electrode located right above the second recess region.

2. The light-emitting device according to claim 1, wherein the first non-recess region has an uneven surface selected from a group consisting of a plurality of hexagonal-pyramid cavities, a plurality of convexes, and a plurality of concaves.

3. The light-emitting device according to claim 1, wherein a roughness of the first recess region is less than that of the first non-recess region.

4. The light-emitting device according to claim 3, wherein a surface of the first recess region comprises a flat surface.

5. The light-emitting device according to claim 1, further comprising a bonding layer between the semiconductor stack layer and the substrate.

6. The light-emitting device according to claim 5, further comprising a reflective layer between the bonding layer and the substrate.

7. The light-emitting device according to claim 1, wherein a depth from the first non-recess region to the first recess region is about 100 nm~1 µm.

8. The light-emitting device according to claim 1, further comprising:
   a first current spreading layer formed on the second semiconductor layer and the first current blocking layer, wherein
   the first electrode is formed on the first current spreading layer and located right above the first recess region.

9. The light-emitting device according to claim 1, wherein a depth from the second non-recess region to the second recess region is about 100 nm~1 µm.

10. The light-emitting device according to claim 1, wherein the second non-recess region has an uneven surface selected from a group consisting of a plurality of hexagonal-pyramid cavities, a plurality of convexes, and a plurality of concaves.

11. The light-emitting device according to claim 1, wherein a roughness of the second recess region is less than that of the second non-recess region.

12. The light-emitting device according to claim 11, wherein a surface of the second recess region comprises a flat surface.

13. The light-emitting device according to claim 1, further comprising:

a second current spreading layer formed on the first semiconductor layer and the second current blocking layer, wherein the second current spreading layer covers at least a portion of the second surface; and wherein the second electrode is formed on the second current spreading layer.

14. The light-emitting device according to claim 13, wherein a material of the second current spreading layer is selected from a group consisting of GaP, ITO, InO, SnO, CTO, ATO, ZnO, and the combination thereof.

15. The light-emitting device according to claim 1, wherein a material of the second current blocking layer is selected from a group consisting of dielectric materials, Su8, BCB, PFOB, epoxy, Acrylic Resin, COC, PMMA, PET, PC, polyetherimide, fluorocarbon polymer, silicone, glass, Al2O3, SiO2, SiNx, SiO2, TiO2, insulating material, and the combination thereof.

16. The light-emitting device according to claim 1, wherein the first recess region has a reflectivity which is at least 70% of that of an aluminum mirror.

17. The light-emitting device according to claim 1, wherein the second recess region has a reflectivity which is at least 70% of that of an aluminum mirror.

* * * * *